(12) United States Patent
Arnz

(10) Patent No.: US 9,014,505 B2
(45) Date of Patent: Apr. 21, 2015

(54) METHOD AND DEVICE FOR DETERMINING THE POSITION OF A FIRST STRUCTURE RELATIVE TO A SECOND STRUCTURE OR A PART THEREOF

(75) Inventor: Michael Arnz, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 88 days.

(21) Appl. No.: 13/491,729

(22) Filed: Jun. 8, 2012

(65) Prior Publication Data

US 2012/0314910 A1    Dec. 13, 2012

Related U.S. Application Data

(60) Provisional application No. 61/495,064, filed on Jun. 9, 2011.

(30) Foreign Application Priority Data

Jun. 9, 2011    (DE) .......................... 10 2011 077 296

(51) Int. Cl.
*G06K 9/00* (2006.01)
*G03F 7/20* (2006.01)

(52) U.S. Cl.
CPC .................................. *G03F 7/70633* (2013.01)

(58) Field of Classification Search
None
See application file for complete search history.

(56) References Cited

U.S. PATENT DOCUMENTS

| | | | |
|---|---|---|---|
| 6,724,915 B1* | 4/2004 | Toklu et al. | 382/103 |
| 6,842,538 B2* | 1/2005 | Lee et al. | 382/224 |
| 7,065,239 B2* | 6/2006 | Maayah et al. | 382/145 |
| 7,120,315 B2* | 10/2006 | Barkan | 382/294 |
| 7,242,801 B1* | 7/2007 | Wallack et al. | 382/173 |
| 7,362,916 B2* | 4/2008 | Yamazaki | 382/275 |
| 7,450,739 B2* | 11/2008 | Yonaha | 382/118 |
| 7,580,071 B2* | 8/2009 | Uchiyama | 348/251 |
| 7,689,029 B2* | 3/2010 | Onishi et al. | 382/149 |

(Continued)

FOREIGN PATENT DOCUMENTS

| DE | 102007033815 | 11/2008 | ............... G03F 9/00 |
|---|---|---|---|
| DE | 102007033815 A1 * | 11/2008 | |

(Continued)

OTHER PUBLICATIONS

Furuya, Comics Data Reduction Manual Ver.2.1.1, Subaru Telescope, National Astronomical Observatory of Japan, pp. 1-43, May 14, 2008.

*Primary Examiner* — Jon Chang
*Assistant Examiner* — Oneal R Mistry
(74) *Attorney, Agent, or Firm* — Fish & Richardson P.C.

(57) ABSTRACT

The position of a first structure relative to a second structure can be determined by a) providing a reference image containing the first structure, b) providing a measurement image containing the second structure, in which the measurement image is recorded with an image sensor with a plurality of sensor pixels and the image sensor has at least one known faulty sensor pixel, c) producing a masked measurement image with a masked region that corresponds to the second structure, and forming an optimization function of the shift of the masked measurement image and the reference image relative to each other, d) determining the extreme value of the optimization function and determining the optimum value of the shift based on the extreme value, and e) determining the position of the first structure relative to the second structure on the basis of the optimum shift value.

20 Claims, 7 Drawing Sheets

(56) References Cited

U.S. PATENT DOCUMENTS

Figure 1:
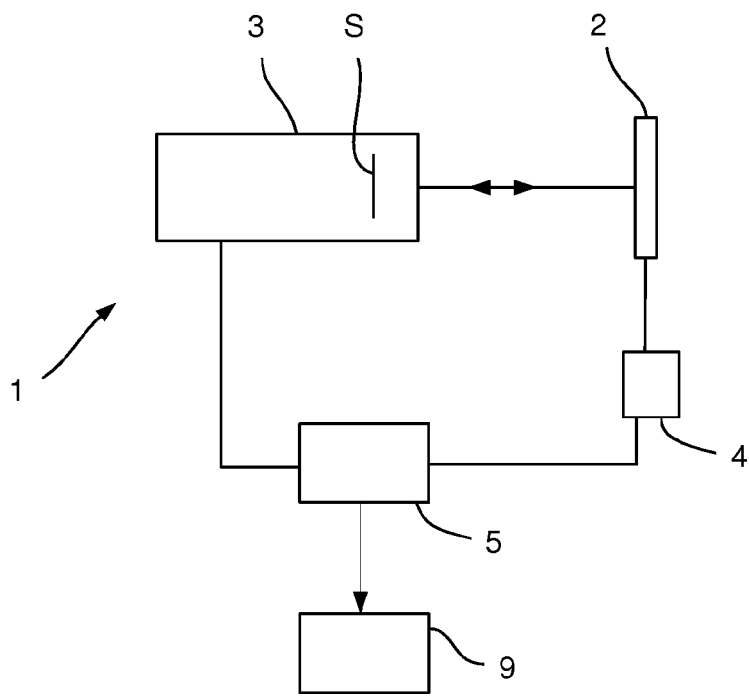

| | | | |
|---|---|---|---|
| 7,864,231 B2 * | 1/2011 | Sakamoto | 348/247 |
| 8,081,232 B2 * | 12/2011 | Sakamoto et al. | 348/222.1 |
| 8,274,582 B2 * | 9/2012 | Kimura | 348/246 |
| 2003/0016860 A1 * | 1/2003 | Sugawara | 382/151 |
| 2003/0076989 A1 * | 4/2003 | Maayah et al. | 382/145 |
| 2003/0091914 A1 * | 5/2003 | Cho | 430/22 |
| 2003/0228045 A1 * | 12/2003 | Asai et al. | 382/141 |
| 2004/0228516 A1 * | 11/2004 | Golan et al. | 382/147 |
| 2007/0076976 A1 * | 4/2007 | Uhrich et al. | 382/275 |
| 2007/0230770 A1 * | 10/2007 | Kulkarni et al. | 382/149 |
| 2008/0181484 A1 * | 7/2008 | Litichever et al. | 382/145 |
| 2010/0150426 A1 * | 6/2010 | Onishi et al. | 382/144 |
| 2010/0208935 A1 | 8/2010 | Arnz et al. | 382/100 |
| 2010/0254611 A1 | 10/2010 | Arnz | 382/199 |

FOREIGN PATENT DOCUMENTS

| | | | |
|---|---|---|---|
| DE | 102009015594 | 10/2010 | G01B 11/03 |
| DE | 102009035290 | 2/2011 | G03F 9/00 |
| WO | WO0074391 A1 * | 5/2000 | H04N 9/64 |
| WO | WO 2008145210 A1 * | 12/2008 | |
| WO | 2011/012265 | 2/2011 | G03F 7/20 |

* cited by examiner

METHOD AND DEVICE FOR DETERMINING THE POSITION OF A FIRST STRUCTURE RELATIVE TO A SECOND STRUCTURE OR A PART THEREOF

CROSS REFERENCE TO RELATED APPLICATIONS

This application claims priority to German patent application DE 102011077296.0, filed on Jun. 9, 2011, and U.S. provisional application 61/495,064, filed on Jun. 9, 2011. The above applications are incorporated by reference.

DESCRIPTION

The present invention relates to a method and device for determining the position of a first structure relative to a second structure or a part thereof.

A method for determining the relative overlay shift of stacked layers is known from DE 10 2007 033 815 A1, in which, according to claim 1 of this publication, the reference or measurement image is weighted such that the first or second pattern element is emphasized relative to the other pattern element and the relative shift of the corresponding pattern element is then determined on the basis of the weighted image and non-weighted measurement or reference image. As this determination is carried out by means of cross-correlation, discontinuities introduced during the weighting would mean that an accurate determination of the relative shift is not possible. Therefore, according to paragraph no. 45 on page 4 of DE 10 2007 033 815 A1, the weighting is carried out such that as far as possible no additional discontinuities in the colour distribution are introduced.

The disadvantage of the limitation that no additional discontinuities may be introduced during the weighting is that the method known from DE 10 2007 033 815 A1 is not transferable to closely adjacent pattern elements separated by less than λ/NA (λ=wavelength of the light during recording and NA=numerical aperture of the recording lens system), or to other measuring tasks from metrology, such as e.g. the measurement of line widths.

A method for determining the position of an edge of a marker structure with subpixel accuracy in which the position determination is carried out with subpixel accuracy via a threshold value determination is known from DE 10 2009 015 594 A1. A method and a device for determining the position of a first structure relative to a second structure or a part thereof are known from DE 10 2009 035 290 A1, in which an optimization function is formed with the shift of the two pictures containing the two structures relative to each other as parameter, wherein the optimization function overlays the two pictures and masks the overlay such that in a determination of an extreme value of the optimization function a contribution is made only by the region of the overlay that corresponds to the second structure or the part thereof.

It was shown that with these methods undesired position determination errors occur when the image sensor which is used to produce the pictures has at least one faulty sensor pixel. Such a faulty sensor pixel can be e.g. defective or have a dark current which is too high.

If the faulty sensor pixel has too high a dark current, the image sensor can be operated with less modulation during the recording in order to ensure that the at least one faulty sensor pixel contains meaningful image information. To this end, the modulation selected should be such that the faulty sensor pixel is still operated in the linear, and not in the non-linear, range. However, this leads to a very narrow dynamic range for the remaining sensor pixels, resulting in a poor signal-to-noise ratio, which is in turn disadvantageous for the position determination.

If the image information of a faulty sensor pixel cannot be used or if the faulty sensor pixel does not supply image information, there will be a gap in the picture. To close this gap, for example to produce the image information for faulty sensor pixels, the original image information (if available) can be discarded and an interpolation method carried out instead, using the adjacent pixels. However, errors are then introduced in the position determination.

The invention provides a method for determining the position of a first structure in a reference image relative to a second structure in a measurement image or to a part of the second structure, which has a high degree of accuracy even if the image sensor for recording the measurement image contains a faulty sensor pixel. Furthermore, an appropriate device is to be provided.

A method for determining the position of a first structure relative to a second structure or a part thereof is provided, the method including the steps:
a) providing a reference image containing the first structure with a plurality of image pixels,
b) providing a measurement image containing the second structure with a plurality of image pixels, wherein the measurement image is recorded with an image sensor with a plurality of sensor pixels and the image sensor has at least one known faulty sensor pixel,
c) producing a masked measurement image with a masked region which corresponds to the second structure or part thereof and from which the section of the measurement image corresponding to the at least one faulty pixel is excluded, wherein in the determination of the relative position only the masked region makes a contribution, and forming an optimization function of the shift of the masked measurement image and the reference image relative to each other,
d) determining the extreme value of the optimization function and determining the optimum value of the shift based on the extreme value of the optimization function, and
e) determining the position of the first structure relative to the second structure or a part thereof on the basis of the optimum shift value determined in step d).

With the masking by means of the masked measurement image, a keyhole effect is achieved which leads to only the masked region of the overlay of the two images being taken into account in the determination of the extreme value in step d). According to step c), the masked region is selected such that the second structure or part thereof lies therein, e.g. in an overlay of measurement and reference image, and the image information of the faulty sensor pixel is masked or punched out and thus not taken into account, with the result that with the optimization function a comparison of the second structure or the part thereof with the first measurement image shifted, preferably stepwise (in particular subpixel-by-subpixel), relative thereto is always carried out, wherein as a result of the masking naturally only the region of the reference image lying inside the masking, and thus not the region corresponding to the faulty sensor pixel, is taken into account in the determination of the extreme value.

With the method according to the invention, it is possible to separate very closely adjacent pattern elements of the first structure the distance between which is e.g. less than λ/NA by masking, and/or to mask edges of the second structure and to determine their relative position with a high degree of accuracy, with the result that for example line widths can be determined.

In the method according to the invention, the optimization function can overlay the masked measurement image and the reference image, wherein the masked measurement image is produced by masking the overlay stationary relative to the measurement image.

Such an optimization function can be well represented mathematically and solved in step d).

In the method, in step c), to produce the masked measurement image, the image pixel or pixels which corresponds or correspond to the at least one faulty sensor pixel can be excluded from the masked region. The desired masking can thus be carried out particularly easily.

In the method according to the invention, the optimization function according to step c) can take the weighted sum of the squared difference of the brightness values of the two images over all the pixels and produce the masking of the measurement image by means of the weighting. With such an optimization function, the desired relative position can be determined with a very high degree of accuracy, in particular subpixel accuracy.

In particular, step c) can also be understood to mean that an optimization function is formed with the shift of measurement and reference images relative to each other as parameter, wherein the optimization function overlays measurement and reference images and masks the overlay stationary relative to the measurement image such that, in a determination of an extreme value of the optimization function, only the region of overlay which corresponds to the second structure or part thereof and which does not simultaneously correspond to the at least one faulty sensor pixel makes a contribution.

In step d), a stepwise shift can preferably be carried out with subpixel steps to determine the extreme value. Even with such shift steps, for which the corresponding pixel values of the e.g. shifted reference image are to be determined by interpolation, determination of the position can be carried out with a high degree of accuracy.

In particular in step c), the optimization function can be formed such that it has the shift of the reference image relative to the masked measurement image as parameter. This can be particularly well represented mathematically and solved in step d).

The shift in step c) is in particular a cyclic shift. By a cyclic shift is here meant in particular that the image information which is pushed beyond the edge e.g. of the masked measurement image in the overlay is pushed into the image again on the opposite side.

The simplified mathematical representation of the optimization function and the determination according to step d) are made possible by the masking stationary relative to the measurement image.

The two images (measurement and reference images) preferably have the same number of pixels. This simplifies the carrying out of steps c) and d). In step c), in particular a pixel-by-pixel subtraction is carried out, with the result that for each shift of reference image and masked measurement image relative to each other there is a one-to-one allocation of the image pixels of the two images. A weighted sum of the reference image and the masked measurement image is taken over the image pixels by the optimization function.

The optimization function can have at least one further parameter which is taken into account in step d). This can be in particular a different modulation or a different dynamic range of measurement and reference images, a rotation of measurement and reference images relative to each other and/or a brightness offset of measurement and reference images.

The measurement and reference images can be derived from different parts of the same picture. However it is also possible for the measurement and the reference images to be separate images obtained e.g. with the same type of image recording.

The reference image can be recorded by means of a region of the image sensor containing no faulty sensor pixels. It is also possible for the reference image to be produced by simulation.

Furthermore, the method according to the invention can have a step for determining faulty sensor pixels in the image sensor before step b).

The image sensor is preferably a CCD sensor or a CMOS sensor.

The measurement and reference images can each be two or also three-dimensional images, wherein the shift according to step c) is then a two or three-dimensional shift. Higher-dimensional images are also possible in which e.g. further properties (e.g. physical properties such as, e.g. polarization effects) form the further dimensions.

In the method according to the invention, before carrying out step d) the position of the first structure relative to the second structure or part thereof can be determined with pixel accuracy by means of a customary method. This relative position determined with pixel accuracy is then used as a starting value or initial value for carrying out steps d) and e) in order to thus carry out the position determination with subpixel accuracy.

A device for determining the position of a first structure relative to a second structure or part thereof is further provided, wherein the device has an evaluation module for which a reference image containing the first structure with a plurality of image pixels and a measurement image containing the second structure with a plurality of image pixels are provided, wherein the measurement image is recorded with an image sensor with a plurality of sensor pixels and the image sensor has at least one known faulty sensor pixel, and the evaluation module carries out the following steps:

A) producing a masked measurement image with a masked region which corresponds to the second structure or the part thereof and from which the section of the measurement image corresponding to the at least one faulty pixel is excluded, wherein in the determination of the relative position only the masked region makes a contribution, and forming an optimization function of the shift of the masked measurement image and the reference image, B) determining the extreme value of the optimization function and determining the optimum value of the shift based on the extreme value of the optimization function, and C) determining the position of the first structure relative to the second structure or the part thereof on the basis of the optimum shift value determined in step B).

With this device, the position of the first structure relative to the second structure or part thereof can be determined with a high degree of accuracy even if the image sensor contains at least one faulty sensor pixel.

With the device according to the invention, the evaluation module can form the optimization function such that the optimization function overlays the masked measurement image and the reference image, wherein the masked measurement image is produced by masking the overlay stationary relative to the measurement image.

Furthermore, the evaluation module in step A) can exclude the image pixel or image pixels which corresponds or correspond to the at least one faulty sensor pixel from the masked region in order to produce the masked measurement image.

Furthermore, in the device according to the invention, the optimization function according to step A) can take the weighted sum of the squared difference of the brightness values of the measurement image and the reference image over all image pixels and produce the masking of the measurement image by means of the weighting.

The evaluation module can form the optimization function in step A) such that it has the shift of the reference image relative to the masked measurement image as parameter.

The shift in step A) can be a cyclic shift.

With the device according to the invention, in step B) a stepwise shift can be carried out with subpixel steps to determine the extreme value.

Furthermore, the optimization function can have at least one further parameter which is taken into account in step B).

With the device according to the invention, the at least one further parameter can be a different modulation of reference and measurement images, a rotation of reference and measurement images relative to each other and/or a brightness offset of reference and measurement images.

The reference and the measurement images can in each case be two- or three-dimensional images and the shift according to step A) can be a two- or three-dimensional shift.

The device according to the invention can contain the image sensor with the plurality of sensor pixels and the at least one known faulty sensor pixel, wherein the measurement image is recorded by means of the image sensor.

The reference image can be recorded by means of a region of the image sensor containing no faulty sensor pixels.

The reference image can alternatively be produced by simulation.

In particular, the evaluation module in step A) can form an optimization function with the shift of measurement and reference images relative to each other as parameter, wherein the optimization function overlays measurement and reference images and masks the overlay stationary relative to the measurement image such that, in a determination of an extreme value of the optimization function, only the region of overlay which corresponds to the second structure or the part thereof and which does not simultaneously correspond to the at least one faulty sensor pixel makes a contribution.

With the method according to the invention and the device according to the invention, the relative position of two structures, which are in particular formed identical, can be determined with a high degree of accuracy. In particular, the determination can take place with subpixel accuracy, wherein as a rule an image pixel of the measurement image and optionally of the reference image corresponds to a sensor pixel of the image sensor.

This position determination according to the invention can e.g. be used for determining the overlay shift, determining the position of an edge. This determination can be used for metrology measurements, for error analysis, for the prepositioning of the repair of e.g. masks or for other image analyses and processes.

It is understood that the features mentioned above and those yet to be explained below can be used, not only in the stated combinations, but also in other combinations or alone, without departing from the scope of the present invention. The device according to the invention can in particular be developed such that the method according to the invention (including the developments of the method according to the invention) can be carried out with it. Furthermore, the method according to the invention can be developed such that it has method steps which are carried out by the device according to the invention including its developments.

Figure 2:
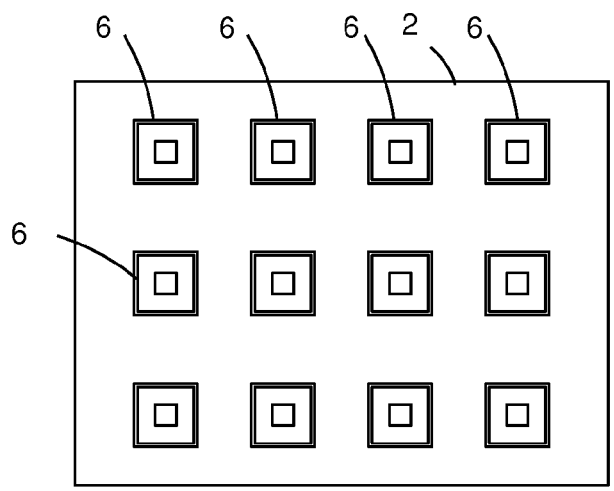
Figure 3A:
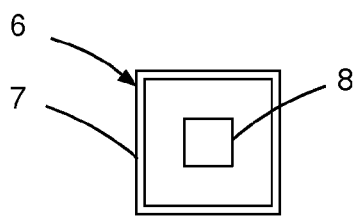
Figure 3B:
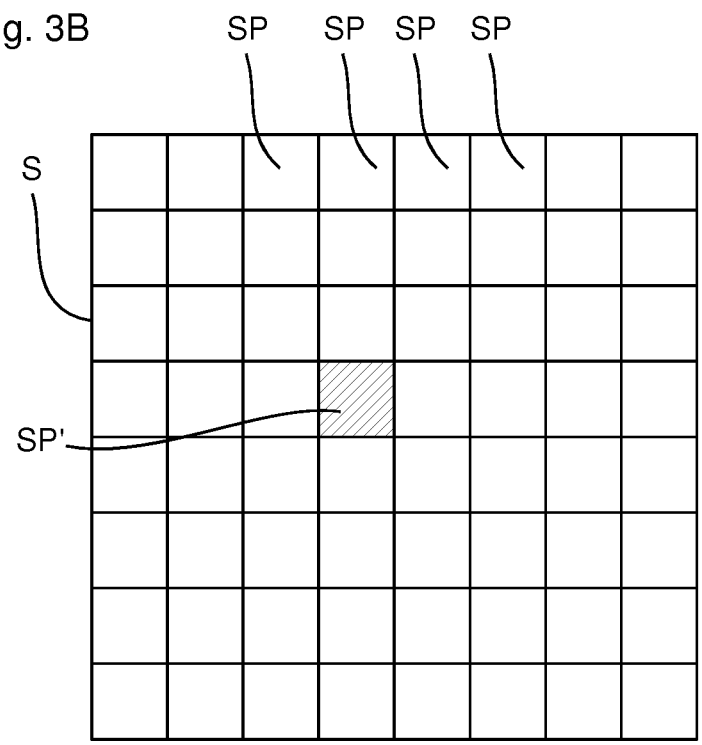
Figure 6C:
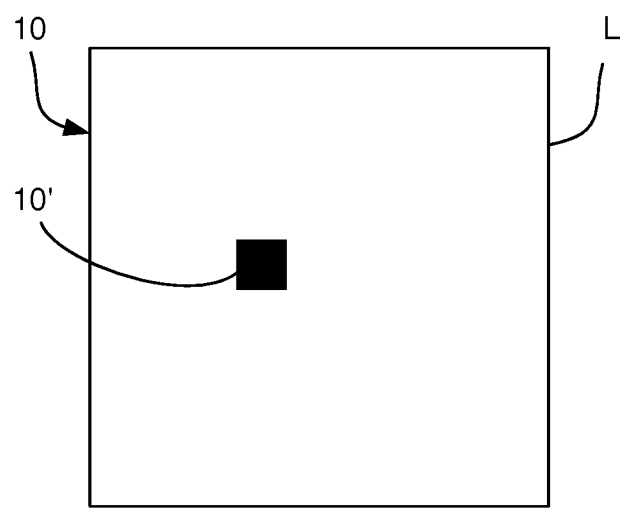
Figure 4:
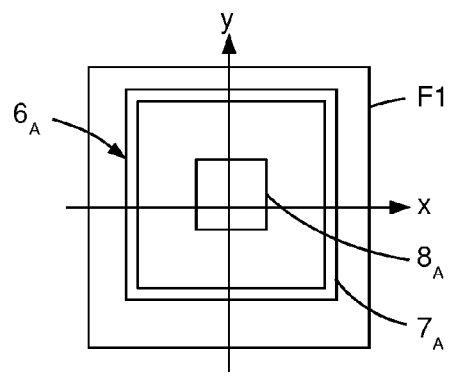
Figure 5:
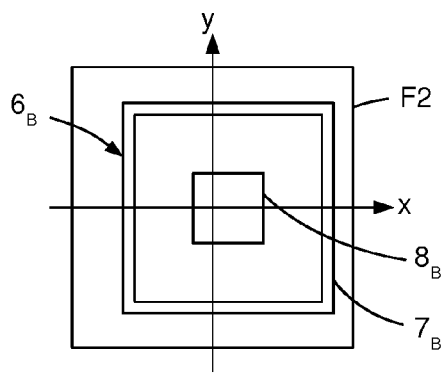
Figure 6A:
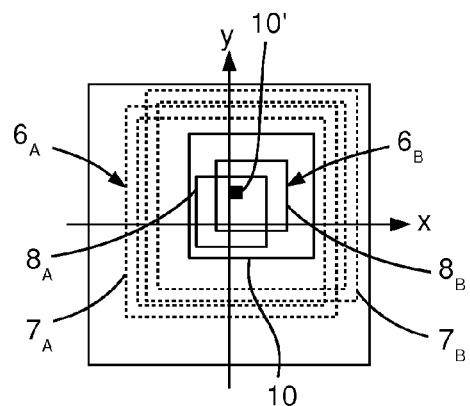
Figure 6B:
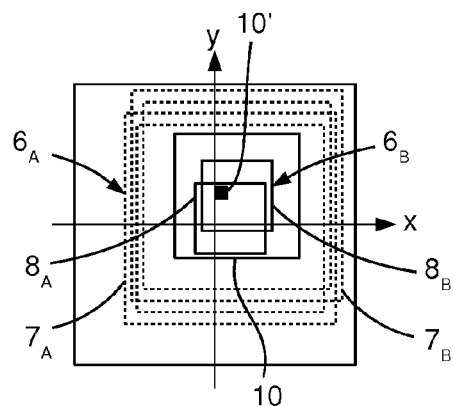
Figure 7:
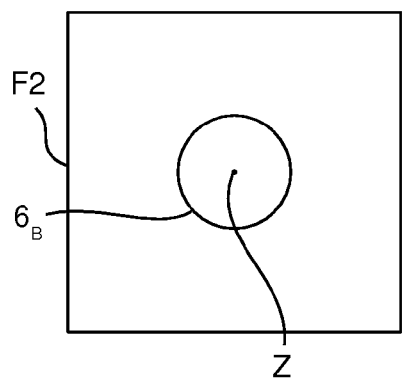
Figure 8:
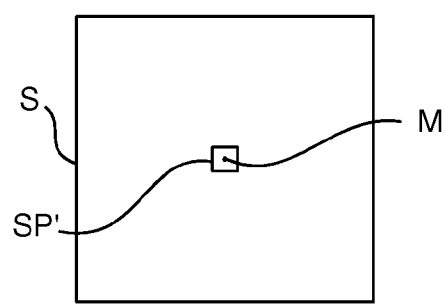
Figure 9A:
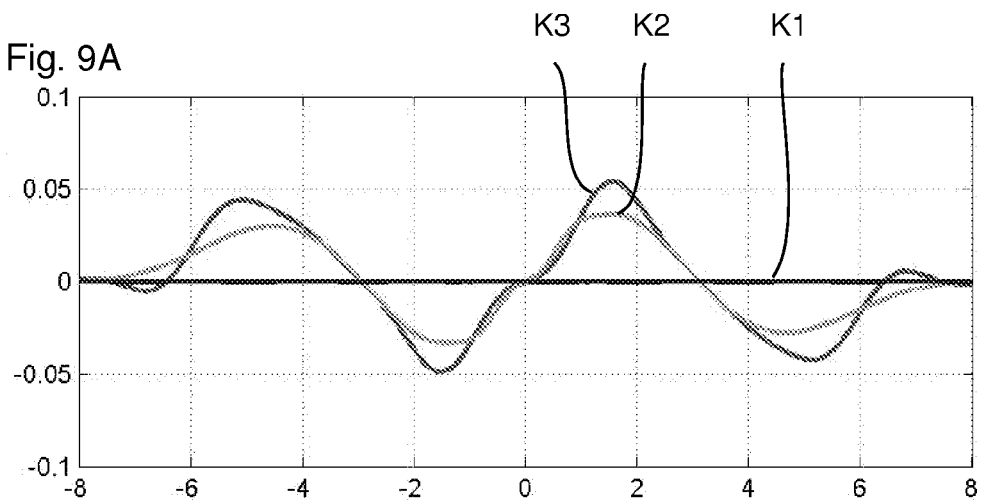
Figure 9B:
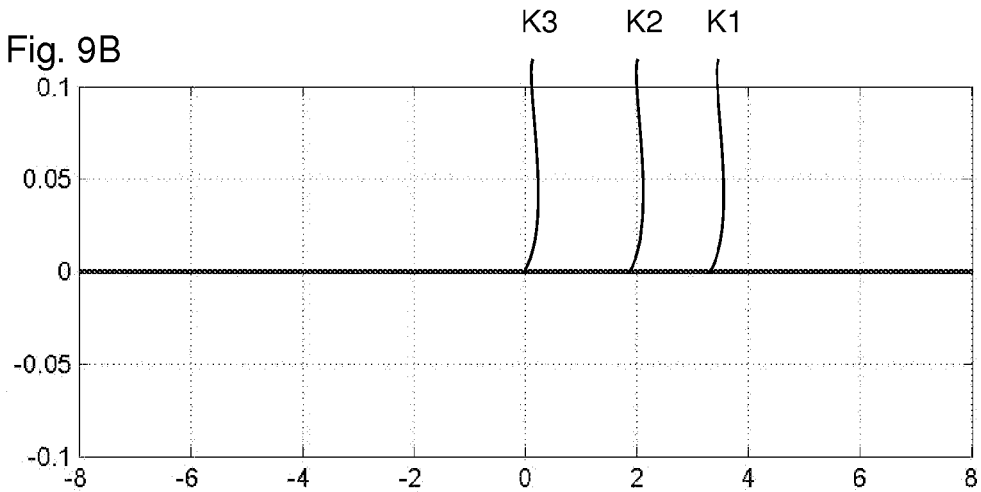
Figure 10:
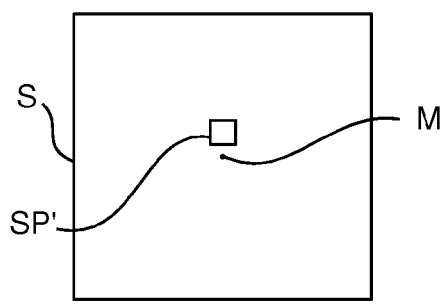
Figure 11A:
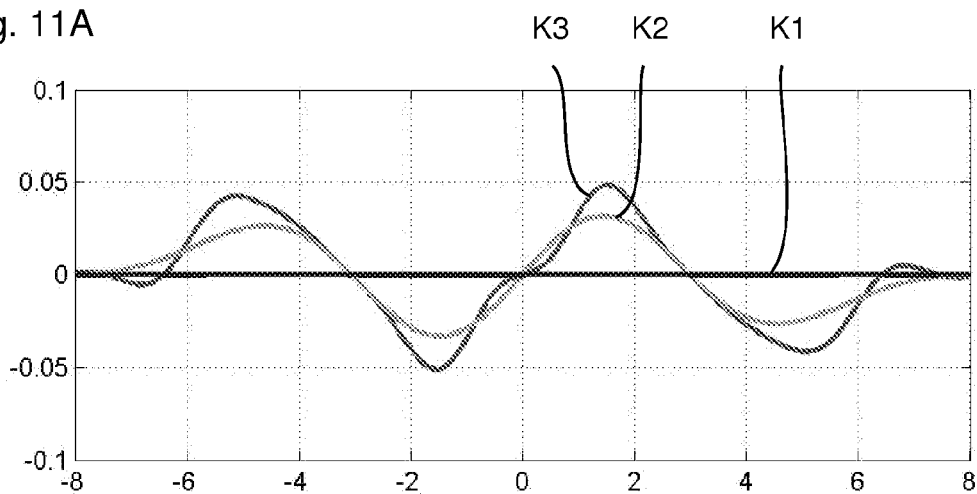
Figure 11B:
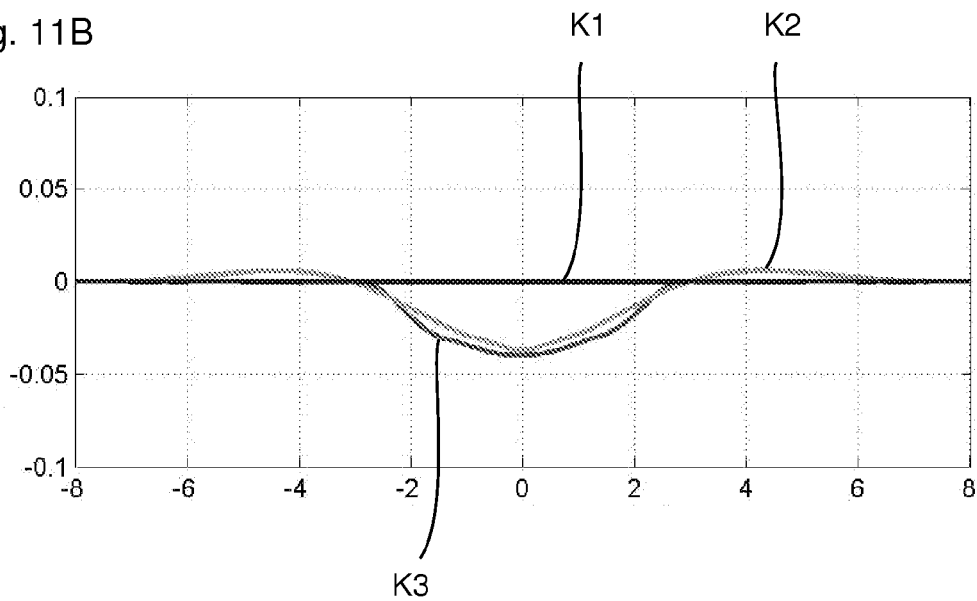
Figure 12:
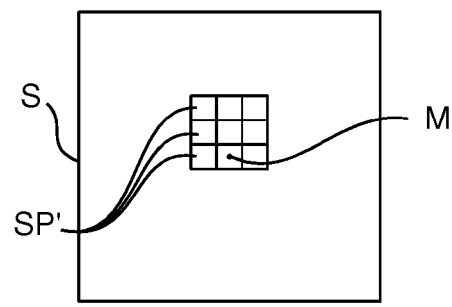
Figure 13A:
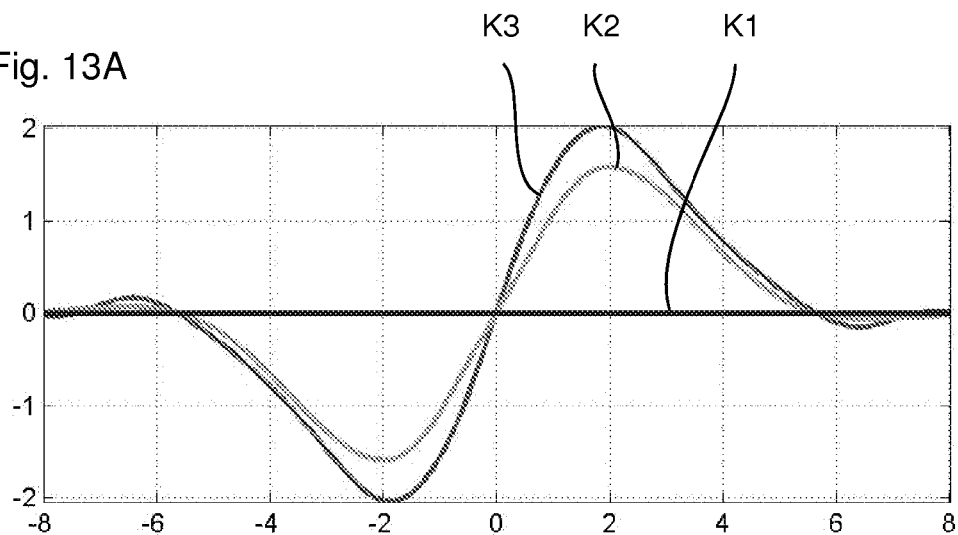
Figure 13B:
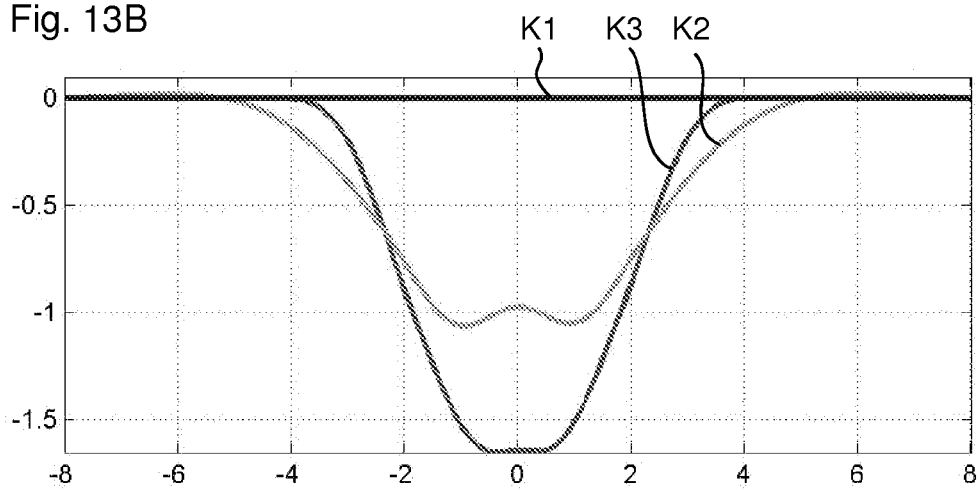
Figure 14A:
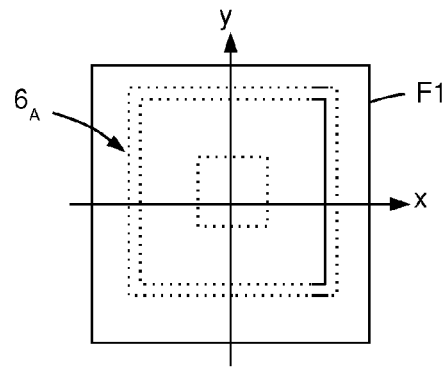
Figure 14B:
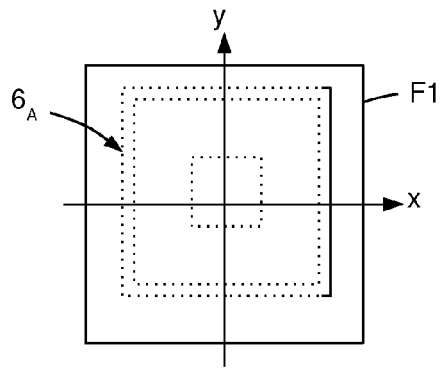
Figure 15:
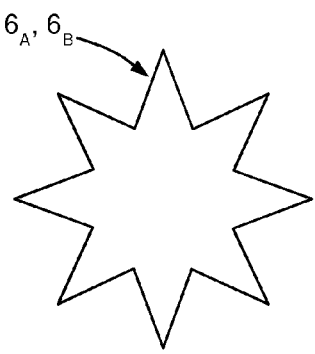
Figure 16:
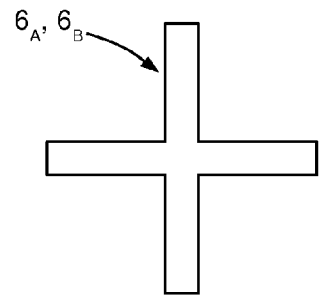
Figure 17:
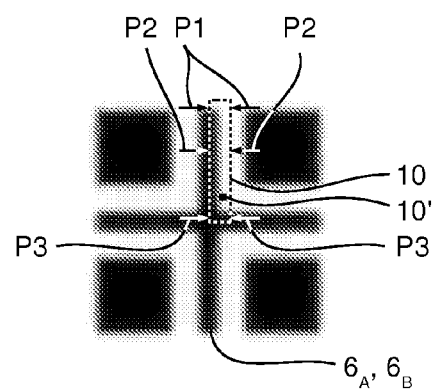

The invention is explained in further detail below by way of example with reference to the attached drawings which also disclose features useful to the invention. There are shown in:

FIG. 1 a schematic view of an example measurement device according to the invention;

FIG. 2 a top view of the lithography mask 2 from FIG. 1;

FIG. 3A an enlarged view of a measurement pattern 6 of the lithography mask 2;

FIG. 3B a schematic representation of the sensor pixels SP of the image sensor S;

FIG. 4 a schematic representation of a first picture F1;

FIG. 5 a schematic representation of a second picture F2;

FIGS. 6A, 6B schematic representations of different shift positions of the first picture F1 relative to the second picture F2;

FIG. 6C an enlarged schematic representation of the masking;

FIG. 7 a schematic representation of a measurement image with a circular second structure $6_B$;

FIG. 8 a schematic representation of the position of the faulty sensor pixel SP' of the image sensor S;

FIG. 9A a schematic representation of the error in the determination of the x position of the second structure $6_B$ when using the image sensor according to FIG. 8 for different position determination methods in relation to the pixel shift present in the horizontal direction between the central point M of the image sensor and the centre Z of the second structure $6_B$ during recording of the measurement image;

FIG. 9B the same representation as FIG. 9A of the error in the determination of the y position;

FIG. 10 a schematic representation of a different position of the faulty sensor pixel SP' of the image sensor S;

FIGS. 11A, 11B representations corresponding to FIGS. 9A and 9B for the image sensor according to FIG. 10;

FIG. 12 an image sensor S with nine faulty sensor pixels SP';

FIGS. 13A, 13B representations identical to FIGS. 9A and 9B for the image sensor S according to FIG. 12;

FIGS. 14A, 14B schematic representations for the masking of the second picture F2 for the determination of the line width;

FIGS. 15, 16 enlarged views of further shapes of the measurement pattern, and FIG. 17 a cross structure with masking drawn in.

FIG. 1 shows schematically a measurement device 1 according to the invention for measuring a lithography mask 2. The measurement device 1 comprises a recording device 3 which has a schematically represented image sensor S with a plurality of sensor pixels and with which sections of the lithography mask 2 can be recorded enlarged, a positioning device 4 which can set the position or location of the lithography mask 2 relative to the recording device 3 in a controlled manner, as well as a control device 5 for controlling the measurement device 1.

FIG. 2 shows schematically a top view of the lithography mask 2 which has a plurality of measurement patterns 6 which are not to scale, but clearly shown enlarged. Between the measurement patterns 6, the lithography mask 2 has mask sections relevant for the exposure the structuring of which is not drawn in here, in order to simplify the representation.

FIG. 3A is an enlarged representation of the measurement pattern 6. As this representation shows in particular, the measurement pattern 6 comprises a frame 7 in which an inner square 8 lies.

FIG. 3B represents schematically the image sensor S, which is here e.g. a CMOS sensor, with 8×8 sensor pixels SP. Naturally, as a rule the image sensor S has a much higher number of sensor pixels SP. A pixel number of 8×8 is assumed here, purely for simplification of the description.

The sensor S has a faulty sensor pixel SP' which is represented shaded and known. Thus a faulty sensor pixel SP' can e.g. easily be detected by the recording of a very dark surface with a long exposure by the image sensor S. The sensor pixels SP, which are bright in the picture and thus have a high dark current or a dark current which lies above a predetermined threshold value, are then identified as faulty sensor pixels SP'.

Such faulty sensor pixels SP' as a rule lead to undesired errors in the desired determination of the relative position of two adjacent measurement patterns 6, which as a rule increase as the number of faulty sensor pixels SP increases. However, a single faulty sensor pixel SP' can lead to undesirably high error contributions, with the result that even a single faulty sensor pixel SP' is to be taken into account for determining the relative position of two adjacent measurement patterns 6 with a high degree of accuracy.

In order to determine the relative position of two adjacent measurement patterns 6, the measurement patterns 6 are recorded in succession by means of the recording device 3, wherein for each picture the positioning device 4 moves and positions the lithography mask 2 with a high degree of accuracy relative to the recording device 3 with the image sensor. The image data of the individual pictures is fed to the control device 5 which passes this data to an evaluation device 9 according to the invention which can, but need not, be a constituent of the measurement device.

FIG. 4 represents schematically a first picture F1 of a first measurement pattern $6_A$ and FIG. 5 a second picture F2 of a second measurement pattern $6_B$.

As the first picture F1 serves as reference image, the picture has been taken such that a region of the image sensor S which contains no faulty sensor pixels SP' is used for this.

Alternatively, the reference image can be produced by simulation. In this case the image sensor S is thus not used to obtain the reference image, but a simulation is carried out with which the first measurement pattern $6_A$ including the precise position (based on the simulation of the optimum position) is produced. This alternative for producing the reference image is advantageous e.g. if a picture of the first measurement pattern $6_A$ without a faulty sensor pixel SP' is not possible or is impractical and laborious.

In order for example to determine the distance between the two inner squares $8_A$, $8_B$ (first and second structure) of the two measurement patterns $6_A$ and $6_B$, the relative position of the inner squares $8_A$, $8_B$ in the two measurement patterns $6_A$, $6_B$ in the two pictures F1 (=reference image), F2 (=measurement image) must be determined so that the absolute distance between the two inner squares $8_A$, $8_B$ of the two measurement patterns $6_A$ and $6_B$ can be determined on the basis of the relative position in conjunction with the data from the positioning device 4 during recording.

The relative position is determined by means of the least squares method, wherein the first picture or reference image F1 is cyclically shifted relative to the second picture or measurement image F2 and for each shift position the weighted sum is calculated via all the image points of the squared difference of the intensities of the two pictures F1, F2. The shift position at which the thus-calculated value is an extreme value (a maximum or minimum, depending on selection of the sign in the calculation), corresponds to the best approximation for the relative distance to be determined.

The sum of all the image points of the squared difference in the intensities of the two images F1, F2 corresponds in terms of image to the overlay of the two pictures F1, F2, wherein here the second picture F2 is stationary and the first picture F1 is shifted relative thereto.

The weighting of the summation is now selected such that as a result, during the summation a release is brought about in the region in the overlay which contains or corresponds to the inner square $8_B$ of the second picture F2. Furthermore, the region in the overlay which corresponds to the at least one faulty sensor pixel SP' is masked. Thus a masking is carried out which completely suppresses everything outside the masked region in the overlay as well as the region corresponding to the faulty sensor pixel. Thus in the overlay the regions of the first picture that do not lie within the masking 10 after the corresponding shift are completely suppressed. FIGS. 6a and 6b represent schematically two shift positions of the first picture F1 relative to the second picture F2, wherein the parts of the measurement pattern $6_A$, $6_B$ not taken into account due to the masking 10 are represented by dotted lines in the overlay image. The masking for the faulty sensor pixel SP is drawn in schematically as a black square 10'.

In FIG. 6C, only the masking 10 is represented enlarged. Everything which lies inside the edge line L and not in the central sensor pixel region 10' is taken into account in the overlay of the pictures. The image information from the faulty sensor pixel or pixels SP' is virtually punched out by this kind of masking and thus in no way taken into account during comparison of the two images, with the result that this faulty image information makes no contribution, and thus also no faulty contribution, to the determination of the relative position. In particular, it is also unnecessary, as was previously customary, to replace this faulty image information with e.g. interpolated image information. Such an interpolation would inevitably lead to undesired errors.

The shift of the first picture or reference image F1 relative to the second picture or second measurement image F2 is preferably, as already described, a cyclic shift. By cyclic shift is meant here that the image information of the first picture F1, which is pushed beyond the image edge of the second picture F2 or overlay image during the shift, is pushed in again on the respective opposite image edge side of the second picture F2 or overlay image. If, for example, a section of the first picture F1 is pushed beyond the right edge of the second picture F2 or overlay image, this section is pushed back into the image from the left image edge of the second picture F2 or overlay image.

According to the invention, as has already been described, the shift position is sought at which the above-described weighted sum, which is also called optimization function below, assumes an extreme value (maximum or minimum). The shift at this extreme value is the sought relative position of the two inner squares $8_A$, $8_B$ in the two measurement patterns $6_A$, $6_B$ in the two pictures F1, F2, with the result that the absolute distance between the squares $8_A$, $8_B$ can then be determined e.g. with the data of the positioning device 4 during the recording.

The optimization function M(x,y) can be represented e.g. by Formula 1 below:

$$M(x, y) = -\sum_{m=0}^{P-1}\sum_{n=0}^{Q-1} K_{m,n} \cdot [A_{m,n}(x, y) - B_{m,n}]^2 \xrightarrow{(x,y)} \text{maximum} \quad (1)$$

wherein $K_{m,n}$ denotes the standardized 2D masking (also called keyhole masking or keyhole apodization below) with $$\sum_{m=0}^{P-1}\sum_{n=0}^{Q-1} K_{m,n} = 1,$$

$A_{m,n}(x,y)$ denotes the shifted first picture F1 which is shifted by the vector (−x,−y), and $B_{m,n}$ denotes the second picture. The masking $K_{m,n}$ has the punched-out section outlined above of the region which corresponds to the at least one faulty sensor pixel SP'. No image comparison takes place in the punched-out region. The two pictures are the same size and each has P×Q pixels. As a result of the summation, the intensity values of the two pictures which are present in both pictures at the same pixel position (taking into account the shift (−x,−y)) are always subtracted from one another.

As $B_{m,n}$ is not shifted and thus does not depend on the shift vector (−x,−y), the optimization function can be rewritten as follows $$M(x,y) = \sum_{m=0}^{P-1}\sum_{n=0}^{Q-1} K_{m,n} \cdot [2 \cdot A_{m,n}(x,y)B_{m,n} - A_{m,n}(x,y)^2] \xrightarrow{(x,y)} \text{maximum} \quad (2)$$

When a spectral decomposition for the images and the keyhole masking are carried out, Formula 2 can be written as follows $$M(x,y) = \quad (3)$$

$$\frac{1}{P\cdot Q}\sum_{p,q} [\overbrace{2\cdot a_{p,q}\cdot \beta^*_{p,q} - \alpha_{p,q}\cdot \kappa^*_{p,q}}^{=kernel_{p,g}}] \cdot e^{2\pi i(x\cdot \xi_q + y\cdot \eta_p)} \xrightarrow{(x,y)} \text{maximum}$$

wherein here the asterisk (*) indicates that the corresponding variable is complex conjugated.

The following spectral decompositions were carried out for Formula 3 above $$A_{m,n}(x,y) = \frac{1}{P\cdot Q}\sum_{p,q} a_{p,q}\cdot e^{2\pi i([n+x]\cdot \xi_q + [m+y]\cdot \eta_p)} \quad (4)$$

$$A_{m,n}(x,y)^2 = \frac{1}{P\cdot Q}\sum_{p,q} \alpha_{p,q}\cdot e^{2\pi i([n+x]\cdot \xi_q + [m+y]\cdot \eta_p)} \quad (5)$$

$$K_{m,n}\cdot B_{m,n} = \frac{1}{P\cdot Q}\sum_{p,q} \beta_{p,q}\cdot e^{2\pi i(n\cdot \xi_q + m\cdot \eta_p)} \quad (6)$$

$$K_{m,n} = \frac{1}{P\cdot Q}\sum_{p,q} \kappa_{p,q}\cdot e^{2\pi i(n\cdot \xi_q + m\cdot \eta_p)} \quad (7)$$

Furthermore, $\alpha_{p,q}$ denotes the following spectral convolution $$\alpha_{p,q} \equiv (a\otimes a)_{p,q} = \frac{1}{P\cdot Q}\sum_{p',q'} a_{p-p',q-q'}\cdot a_{p',q'} \quad (8)$$

and the functions $\xi_q$, $\eta_p$ are defined according to the following Formulae 9 and 10

$$\xi_q = \frac{q}{Q} - \text{floor}\left(\frac{q}{Q} + \frac{1}{2}\right); q = 0 \ldots Q-1 \quad (9)$$

$$\eta_p = \frac{p}{P} - \text{floor}\left(\frac{p}{P} + \frac{1}{2}\right); p = 0 \ldots P-1 \quad (10)$$

The function floor renders the largest integer of the argument which is smaller than or equal to the argument. In this way, the relative position of the two patterns can be determined numerically with a high degree of accuracy.

As a result of the weighted summation according to the optimization function given above, a hard edge is introduced in the overlay which, however, does not result in the absence of a bandwidth limitation during the spectral decomposition. Thus in the difference according to the kernel$_{p,q}$ in Formula 3, although neither $\beta^*_{p,q}$ nor $\kappa_{p,q}$ are bandwidth-limited, both the minuend and the subtrahend are bandwidth-limited, as $a_{p,q}$ and $\alpha_{p,q}$ are spectrally bandwidth-limited. Because of the convolution according to Formula 8, $\alpha_{p,q}$ has a larger spectral range than $a_{p,q}$ but is still spectrally bandwidth-limited. Thus a very accurate numerical solution to Formula 3 is possible. Moreover, the subtrahend $\alpha\cdot \kappa^*$ can be regarded as a term which balances the effect of the leading cross-correlation term $2\,a\cdot \beta^*$. As a result, there may be inhomogeneities in the intensity on the edge trajectory of the weighting, and the method according to the invention still provides the sought relative position. With customary correlation methods, such as e.g. from DE 10 2007 033 815 A1, such edge inhomogeneities mean that no meaningful results can be determined.

The effect of the masking with the punched-out section of the region which corresponds to the at least one faulty sensor pixel SP' is explained in further detail below in connection with FIGS. 7-13B.

A measurement image F2 in which the second structure $6_B$ is a circle is shown schematically in FIG. 7.

The CMOS sensor S which here is to have exactly one faulty sensor pixel SP' which lies in the centre in sensor S is shown schematically in FIG. 8. The centre of the sensor is represented by a small dot (which is drawn in for illustration only) and is given the reference M.

In FIG. 9A, the error in the determination of the x position of the second structure $6_B$ is plotted in nm along the vertical axis for three different methods (curves K1, K2 and K3). The deviation or the pixel offset of the centre Z of the second structure $6_B$ from the central point M of the CMOS sensor S when carrying out the recording is represented along the horizontal axis. A value of 0 (horizontal axis) thus corresponds to the coincidence of the centre Z with the central point M during the recording. A value of 2 (along the horizontal axis) corresponds to an offset by two sensor pixels SP between centre Z and central point M during the recording.

The curve K1 shows the error in the determination of the x position of the second structure $6_B$ in relation to the described pixel offset during the recording for the method according to the invention with the described masking, including the punched-out section of the region corresponding to the faulty pixel SP'. As shown in FIG. 9A, this error is exactly 0.

In comparison, the curve K2 shows the error in a determination similar to that with the masking according to the invention, wherein however no punching-out of the region of the faulty pixel SP' has been carried out. This type of position determination corresponds to the method according to the German patent application no. 10 2009 035 290 A1. As the profile of the curve K2 shows, there is, in relation to the pixel shift, a corresponding error in the determination of the x position. When the pixel shift is 0, there is no error. In this case, there is such a symmetry that the errors which occur due to interpolation of the image information at the point of the faulty pixel SP' cancel each other out.

The error in the determination of the x position which occurs with the threshold method according to the German patent application 10 2009 015 594 A1 is shown as curve K3.

The error in the determination of the y position is shown in FIG. 9B in the same way as in FIG. 9A. The error in the determination of the y position is plotted in nm along the vertical axis. The pixel offset in x direction when carrying out the recording of the measurement image is shown along the horizontal axis. Due to the symmetrical shape of the second structure $6_B$ and the central position of the faulty pixel SP', the error in the determination of the y position is here 0 for all three methods. However, this is the case only due to the described symmetry.

In FIG. 10, the case for a faulty sensor pixel SP' is shown in which the faulty sensor pixel SP' is offset by one pixel in vertical direction compared with the position in FIG. 8.

FIGS. 11A and 11B show representations corresponding to FIGS. 9A and 9B for the position of the faulty sensor pixel according to FIG. 10. These representations show that, in addition to the error in the determination of the x position, errors also occur in the determination of the y position of the second structure $6_B$ with the method of masking without punching out the faulty sensor pixel as well as with the threshold method. In the method according to the invention of masking including the punching-out of the faulty sensor pixel SP', however, both the error in the determination of the x position and the error in the determination of the y position of the second structure $6_B$ are again exactly 0 (curves K1 in FIGS. 11A and 11B).

FIG. 12 shows the case where the image sensor S has nine faulty sensor pixels SP' which are immediately adjacent to one another and form a square faulty pixel cluster. This faulty pixel cluster is arranged off-centre relative to the central point M of the image sensor S.

FIGS. 13A and 13B again show the errors in the determination of the x position (FIG. 13A) and in the determination of the y position (FIG. 13B) in the same way as in FIGS. 9A and 9B. As the curves K1 in FIGS. 13A and 13B show, the error for the method according to the invention is again exactly 0. Thus no errors occur. With the method of masking without punching out the faulty sensor pixels SP', clear errors occur which reach almost 2 nm for the x position and 1 nm for the y position (the amounts in each case). With the described threshold method (curves K3), the errors are actually even higher.

Naturally, the faulty pixels SP' need not form a continuous region in the image sensor S. They can be arbitrarily distributed regions or individual image pixels. In these examples, with the method according to the invention of masking, the faulty sensor pixel or pixels SP' are punched out during the overlaying of the two images in the manner described, with the result that the image information of these corresponding regions is not taken into account in the determination of the relative position.

If the relative distance between the outer frames $7_A$, $7_B$ (which are then the first and second structures according to the present invention) is also determined in the described manner (in this case always the inner square $8_A$, $8_B$ is suppressed by the weighting), then if the inner squares $8_A$, $8_B$ lie in a first layer and the frames $7_A$, $7_B$ in a second layer, the relative overlay shift of the two layers can be determined from the vector difference of the thus-determined relative position of the two inner squares $8_A$, $8_B$ and the two frames $7_A$, $7_B$ in a manner similar to that according to FIG. 15 of DE 10 2007 033 815 A1.

It has been shown that not all shift positions lead to meaningful results, as the optimization function often has several local maxima or minima. The position of the first structure relative to the second structure or a part thereof is therefore preferably determined relatively roughly by customary methods. By such a relatively rough determination of position is meant here in particular a determination with pixel accuracy. This relative shift in position is then used as it were as a starting value for the optimization function in order to ensure that the extremum then found is also the sought local extremum of the optimization function.

Naturally, further parameters can also be taken into account with this least squares method with weighting according to the invention. Thus e.g. the different modulation of the two images by a further parameter S can be taken into account, as is indicated in the following Formula 11. A brightness offset of the two pictures relative to each other, as indicated by the parameter T in Formula 12, can also additionally be taken into account. These Formulae 11 and 12 can similarly be represented spectrally, in the same way as already described above, and thus solved well numerically.

$$M(x, y, S) = -\sum_{m=0}^{P-1}\sum_{n=0}^{Q-1} K_{m,n} \cdot [A_{m,n}(x, y) - S \cdot B_{m,n}]^2 \xrightarrow{(x,y),S} \text{maximum} \quad (11)$$

$$M(x, y, S, T) = -\sum_{m=0}^{P-1}\sum_{n=0}^{Q-1} K_{m,n} \cdot$$

$$[A_{m,n}(x, y) - S \cdot B_{m,n} - T]^2 \xrightarrow{(x,y),S,T} \text{maximum} \quad (12)$$

The optimization function M according to Formulae 11 and 12 can again be represented as follows (as in Formula 3)

$$M(x, y) = \frac{1}{P \cdot Q} \sum_{p,q} \text{kernel}_{p,q} \cdot e^{2\pi i(x \cdot \xi_q + y \cdot \eta_p)}, \quad (13)$$

wherein only the $\text{kernel}_{p,q}$ is different. For Formula 11, the $\text{kernel}_{p,q}$ is as follows $$\text{kernel}_{p,q} = -\alpha_{p,q} \cdot \kappa^*_{p,q} + ((a \cdot \hat{\beta}^*) \otimes (a \cdot \hat{\beta}^*))_{p,q} \quad (14),$$

wherein, in addition to the abbreviations already given, the following abbreviated notations have been used:

$$\hat{B}_{m,n} \equiv B_{m,n} \Big/ \sqrt{\sum_{m',n'} K_{m',n'} \cdot B^2_{m',n'}} \quad (15)$$

$$\hat{\beta}_{m,n} \equiv \sum_{m,n} K_{m,n} \cdot \hat{B}_{m,n} \cdot e^{-2\pi i(n \cdot \xi_q + m \cdot \eta_p)} \quad (16)$$

The following representation results for the $\text{kernel}_{p,q}$ for Formula 12

$$\text{kernel}_{p,q} = -\alpha_{p,q} \cdot \kappa^*_{p,q} \pm ((a \cdot \hat{\beta}^*) \otimes (a \cdot \hat{\beta}^*)) + ((a \cdot \kappa) \otimes (a \cdot \kappa^*)_{p,q} \quad (17),$$

wherein, in addition to the abbreviations already given, the following abbreviated notations have been used $$\tilde{B}_{m,n} \equiv \frac{B_{m,n} - \left(\sum_{m',n'} K_{m',n'} \cdot B_{m',n'}\right)}{\sqrt{\left(\sum_{m',n'} K_{m',n'} \cdot B_{m',n'}^2\right) - \left(\sum_{m',n'} K_{m',n'} \cdot B_{m',n'}\right)^2}} \quad (18)$$

$$\tilde{B}_{p,q} \equiv \sum_{m,n} K_{m,n} \cdot \tilde{B}_{m,n} \cdot e^{-2\pi i(n \cdot \xi_q + m \cdot \eta_p)} \quad (19)$$

The kernel$_{p,q}$ in Formula 14 for M(x,y,S) according to Formula 11 can be determined in that the partial derivation of the optimization function M(x,y,S) for S is set to zero and this equation is solved for S and inserted in equation 11 with the result that the optimization for the parameter S is already contained in the kernel representation.

In a similar manner, the kernel$_{p,q}$ in Formula 17 for equation 12 can be determined in that the optimization function M(x,y,S,T) according to equation 12 is derived once partially for S and set to zero and once partially for T and set to zero, and the thus-determined equations for S and T are inserted in equation 12.

The line width (CD) can also be determined with the method according to the invention. For this, the weighting need merely be selected such that, in the overlay of the first picture or reference image F1, only the left edge of the right side of the outer square 7 is exposed, as indicated in FIG. 14A by the continuous lines. The dotted lines indicate which part of the measurement pattern 6$_A$ of the first picture F1 is not taken into account due to the masking in the determination of the relative position of this exposed edge with the method described above.

The weighting is then selected such that, in the overlay, only the right edge of the right side of the square 7 is exposed, as is indicated in FIG. 14B in the same way as in FIG. 14A. The relative position is determined here also.

The line width of the right edge of the square 7$_B$ in the second picture or in the measurement image F2 can then be determined from the difference between the two thus-determined relative positions as well as from the knowledge of the line width of the first picture (which can have been determined e.g. by a customary threshold method). This line width determination is easily possible, as the discontinuity introduced by the masking, as has already been outlined above, is practically compensated by the second term α·κ* of Formula 3 to the extent that a numerically highly accurate position determination is possible.

The shape of the measurement pattern 6$_A$ and 6$_B$ is to be understood only as an example. Naturally, any number of different shapes is possible, such as e.g. the examples shown in FIGS. 15 and 16.

With the method according to the invention and the device according to the invention for determining the position of a first structure relative to a second structure or a part thereof, larger image regions can often be evaluated compared with previously known methods, as a result of which the reproducibility and accuracy of the position determination can be increased. In particular, the errors caused by faulty sensor pixels SP' can be excellently suppressed.

A cross structure is shown in FIG. 17. However, with the method according to the invention and the device according to the invention, for example the drawn-in masking 10 for which the edge trajectory of the weighting 10 is not homogeneous in respect of the intensity is possible. In addition, the edge profile is not homogeneous over the total weighting region 10, as is necessary e.g. for threshold value methods in which as a rule two-dimensional edge profiles are evaluated. As is indicated by the arrows P1, P2 and P3 in FIG. 17, the edge profile varies in these sections. As a result of the method according to the invention and the device according to the invention, it is thus advantageously no longer necessary to select the masking such that the edge trajectory as well as the edge profile is homogeneous in respect of the intensity. Thus much larger image regions can be evaluated for the determination of the position of a first structure relative to a second structure or a part thereof.

The features described above related to processing of data, e.g., according to one or more of Formulas 1 to 19, can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. For example, the evaluation device 9 may include one or more such processors that execute instructions for implementing a process for determining the relative position of two adjacent measurement patterns. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a LCD (liquid crystal display) monitor, an electronic ink (E-ink) display, or an organic light emitting diode (OLED) display for displaying information to the user and a keyboard and a pointing device such as a mouse, a trackball, or touchpad by which the user can provide input to the computer. A touch display can also be used in which the display surface is sensitive to touch inputs from a user.

A number of implementations have been described. Nevertheless, it will be understood that various modifications may be made. For example, elements of one or more implementations may be combined, deleted, modified, or supplemented to form further implementations. As yet another example, the logic flows of processes described above do not require the particular order shown, or sequential order, to achieve desirable results. In addition, other steps may be provided, or steps may be eliminated, from the described flows, and other components may be added to, or removed from, the described systems. For example, the measurement patterns can be different from those described above. Accordingly, other implementations are within the scope of the following claims.

What is claimed:

1. A method for determining a position of a first structure relative to a second structure or a part of the second structure, the method comprising:
   a) providing a reference image containing the first structure with a plurality of image pixels,
   b) providing a measurement image containing the second structure with a plurality of image pixels, wherein the measurement image is recorded with an image sensor with a plurality of sensor pixels and the image sensor has at least one known faulty sensor pixel, and the position of the at least one faulty sensor pixel is known,
   c) producing a modified measurement image based on the measurement image of step b), the modified measurement image comprises a masked region which corresponds to the second structure or a part of the second structure and from which a section of the measurement image corresponding to the at least one faulty pixel is excluded, the modified measurement image having a size that is different from the measurement image,
      wherein in the determination of the position of the first structure relative to the second structure or a part of the second structure, only the masked region makes a contribution, and
      forming an optimization function of a shift of the modified measurement image and the reference image relative to each other,
   d) determining an extreme value of the optimization function and determining an optimum value of the shift based on the extreme value of the optimization function, and
   e) determining the position of the first structure relative to the second structure or a part of the second structure based on the optimum shift value determined in step d).

2. The method according to claim 1, in which the optimization function overlays the modified measurement image and the reference image, wherein the modified measurement image is produced by masking the overlay stationary relative to the measurement image.

3. The method according to claim 1, in which in step c), to produce the modified measurement image, the image pixel or pixels which corresponds or correspond to the at least one faulty sensor pixel is or are excluded from the masked region.

4. The method according to claim 1, in which the optimization function according to step c) takes a weighted sum of the squared difference of brightness values of the measurement image and the reference image over all image pixels and produces the masking of the measurement image by means of the weighted sum.

5. The method according to claim 1, in which the reference and the measurement image are derived from different parts of the same picture.

6. The method according to claim 1, in which the reference image is recorded by means of a region of the image sensor containing no faulty sensor pixels.

7. The method according to claim 1, in which the reference image is produced by simulation.

8. The method according to claim 1, in which before step c) the at least one faulty sensor pixel of the image sensor is determined.

9. A device for determining a position of a first structure relative to a second structure or a part of the second structure, the device comprising:
   a storage storing instructions; and
   an evaluation module, for which a reference image containing the first structure with a plurality of image pixels and a measurement image containing the second structure with a plurality of image pixels are provided, wherein the measurement image is recorded with an image sensor with a plurality of sensor pixels and the image sensor has at least one known faulty sensor pixel, the position of the at least one faulty sensor pixel is known, and the evaluation module executes the instructions to carry out the following steps:
   A) producing a modified measurement image based on the measurement image, the modified measurement image comprises a masked region which corresponds to the second structure or a part of the second structure and from which a section of the measurement image corresponding to the at least one faulty pixel is excluded, the modified measurement image having a size that is different from the measurement image,
      wherein in the determination of the position of the first structure relative to the second structure or a part of the second structure, only the masked region makes a contribution,
      and
      forming an optimization function of a shift of the modified measurement image and the reference image,
   B) determining an extreme value of the optimization function and determining an optimum value of the shift based on the extreme value of the optimization function, and
   C) determining the position of the first structure relative to the second structure or a part of the second structure on the basis of the optimum shift value determined in step B).

10. The device according to claim 9, in which the evaluation module (9) forms the optimization function such that the optimization function overlays the modified measurement image and the reference image, wherein the modified measurement image is produced by masking the overlay stationary relative to the measurement image.

11. The device according to claim 9, in which the evaluation module in step A) excludes the image pixel or image pixels which corresponds or correspond to the at least one faulty sensor pixel from the masked region in order to produce the modified measurement image.

12. The device according to claim 9, in which the optimization function according to step A) takes the weighted sum of the squared difference of the brightness values of the measurement image and the reference image over all image pixels and produces the masking of the measurement image by means of the weighted sum.

13. The device according to claim 9, wherein the device contains the image sensor (S) with the plurality of sensor pixels (SP) and the at least one known faulty sensor pixel (SP') and the measurement image is recorded by means of the image sensor (S).

14. The device according to claim 13, in which the reference image is recorded by means of a region of the image sensor (S) containing no faulty sensor pixels.

15. The device according to claim 9, in which the reference image is produced by simulation.

16. A method for determining the position of a first structure relative to a second structure, the method comprising:
   recording, using an image sensor having at least one defective sensor pixel, a measurement image containing the second structure, in which the position of the at least one faulty sensor pixel is known;
   producing a modified measurement image based on the measurement image, the modified measurement image having a size that is different from the measurement image, in which a portion of the measurement image corresponding to the at least one defective sensor pixel is excluded from the modified measurement image and does not contribute to the determination of the position of the first structure; and
   determining the position of the first structure relative to the second structure based on comparisons of a reference image containing the first structure and the modified measurement image that is shifted by known amounts.

17. The method of claim 16, comprising forming an optimization function of the shift of the modified measurement image relative to the reference image, and determining the position of the first structure relative to the second structure based on the optimization function.

18. The method of claim 17, comprising determining an extreme value of the optimization function, determining an optimum value of the shift based on the extreme value of the optimization function, and determining the position of the first structure relative to the second structure based on the optimum shift value.

19. The method of claim 17 in which the optimization function takes a weighted sum of a squared difference of the brightness values of the measurement image and the reference image over a plurality of image pixels and produces the masking of the measurement image based on the weighting.

20. The method of claim 16 in which the reference image is recorded by using a region of the image sensor containing no defective sensor pixels.

* * * * *